(12) United States Patent
Yoo

(10) Patent No.: US 7,944,286 B2
(45) Date of Patent: May 17, 2011

(54) SYSTEMS AND METHODS FOR FILTER TUNING USING BINARY SEARCH ALGORITHM

(75) Inventor: Jung-Hoon Yoo, Seongnam-si (KR)

(73) Assignee: XRONET Corporation (KR)

( * ) Notice: Subject to any disclaimer, the term of this patent is extended or adjusted under 35 U.S.C. 154(b) by 13 days.

(21) Appl. No.: 12/515,856

(22) PCT Filed: Nov. 30, 2007

(86) PCT No.: PCT/KR2007/006132
§ 371 (c)(1),
(2), (4) Date: May 21, 2009

(87) PCT Pub. No.: WO2008/066346
PCT Pub. Date: Jun. 5, 2008

(65) Prior Publication Data
US 2010/0013546 A1    Jan. 21, 2010

(30) Foreign Application Priority Data
Dec. 1, 2006  (KR) .................. 10-2006-0120693

(51) Int. Cl.
*H03M 1/12* (2006.01)
*H03K 3/011* (2006.01)

(52) U.S. Cl. ....................... 327/553; 327/513

(58) Field of Classification Search .............. None
See application file for complete search history.

(56) References Cited

U.S. PATENT DOCUMENTS

| | | | |
|---|---|---|---|
| 4,818,903 A | | 4/1989 | Kawano ..................... 327/553 |
| 5,245,646 A | * | 9/1993 | Jackson et al. ............... 377/2 |
| 5,914,633 A | * | 6/1999 | Comino et al. .............. 327/553 |
| 6,628,163 B2 | * | 9/2003 | Dathe et al. ................. 327/553 |
| 6,670,846 B2 | | 12/2003 | Yamamoto et al. .......... 327/554 |
| 6,677,814 B2 | * | 1/2004 | Low et al. ................... 327/554 |
| 6,803,813 B1 | * | 10/2004 | Pham .......................... 327/553 |
| 7,002,404 B2 | * | 2/2006 | Gaggl et al. ................. 327/553 |
| 7,078,961 B2 | * | 7/2006 | Punzenberger et al. ..... 327/553 |
| 7,339,442 B2 | * | 3/2008 | Godambe .................... 331/135 |
| 7,646,236 B2 | * | 1/2010 | Cicalini ....................... 327/553 |

OTHER PUBLICATIONS

PCT International Search Report dated Mar. 6, 2008 PCT/KR2007/006132.
Written Opinion of the International Searching Authority dated Mar. 6, 2008 PCT/KR2007/006132.

* cited by examiner

*Primary Examiner* — Lincoln Donovan
*Assistant Examiner* — Terry L Englund
(74) *Attorney, Agent, or Firm* — Daly, Crowley, Mofford & Durkee, LLP

(57) ABSTRACT

A filter tuning system for quickly compensating a time constant using a binary search algorithm is disclosed. The filter tuning system includes a time constant detector, a comparator and a calibration unit. The time constant detector detects a time constant of a filter based on an integral value of a reference input signal using an integrator when the time constant of the filter changes according to a variation of a manufacturing process or a temperature. The integrator includes a capacitor changing according to a variation of the time constant of the filter. The comparator compares the detected time constant with a reference value. The calibration unit compensates the time constant of the filter using the binary search algorithm based on the comparison result until an error between the time constant and the reference value is reduced within an acceptable range.

9 Claims, 3 Drawing Sheets

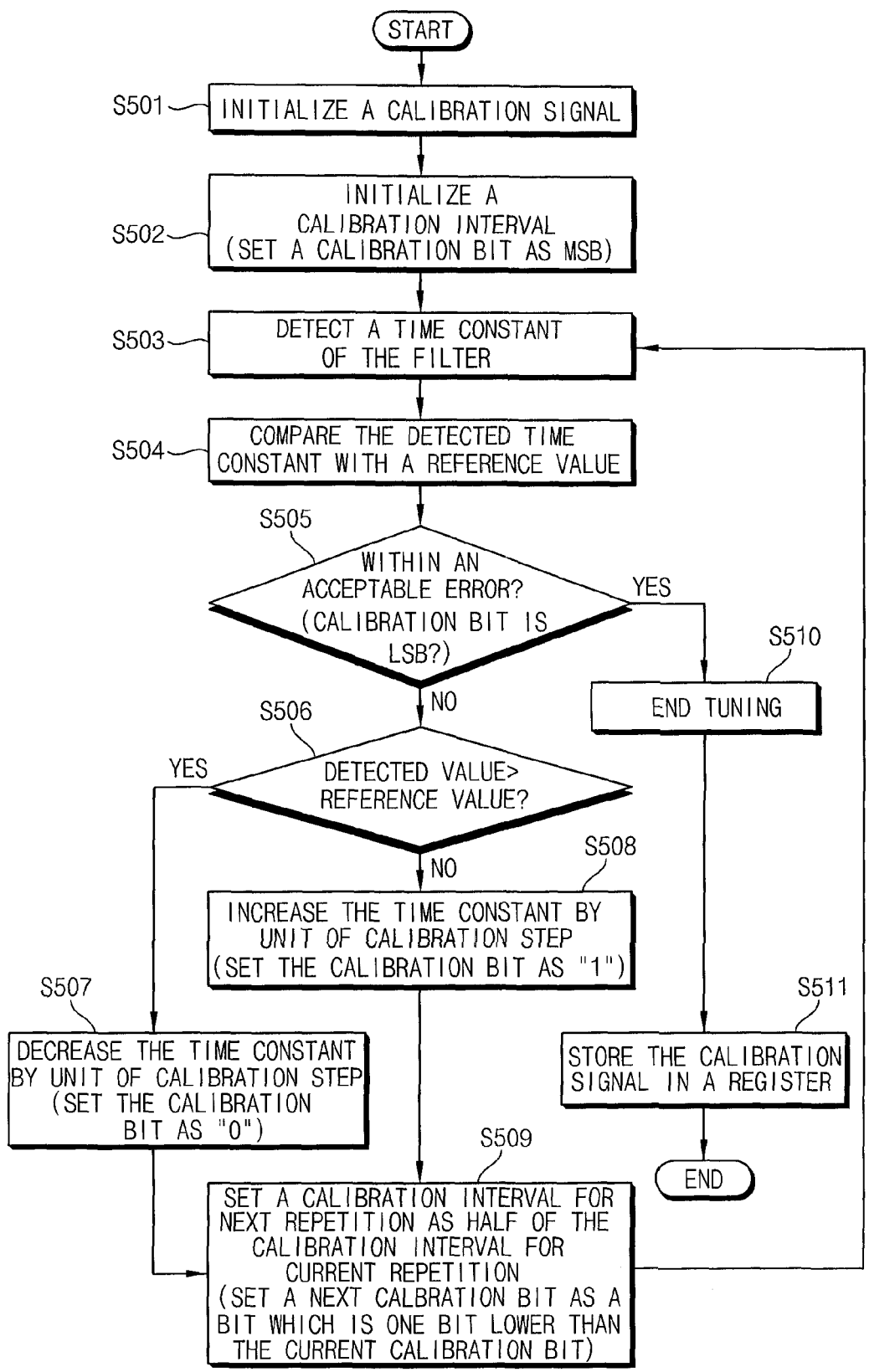

SYSTEMS AND METHODS FOR FILTER TUNING USING BINARY SEARCH ALGORITHM

TECHNICAL FIELD

The present invention relates to a filter tuning system. More particularly, the present invention relates to a filter tuning system for compensating for a variation of a cutoff frequency of a filter caused by a variation of a manufacturing process or a temperature.

BACKGROUND ART

A cutoff frequency of a filter implemented in an integrated chip may change according to a variation of a manufacturing process or a temperature. Thus, a filter tuning system is required for compensating for the changed cutoff frequency. The filter tuning system performs a function of maintaining the time constant of the filter that changes according to the variation of the manufacturing process or the temperature.

A conventional filter tuning system detects the time constant of the filter to compare the detected result with a reference value. Then, the filter tuning system counts up/down based on the comparison result. When an error between the detected time constant and the reference value is relatively large, it may take a long time to count up/down to a predetermined level. In addition, as the filter tuning system has a high resolution and a small calibration interval, it may take a longer time to count up/down to the predetermined level.

DISCLOSURE OF THE INVENTION

Technical Problem

The present invention is provided to overcome an inefficiency of the conventional tuning system. The present invention provides systems and methods for quickly compensating a time constant of a filter using a binary search algorithm after converting the time constant to a voltage signal and comparing the voltage signal with a reference voltage.

Technical Solution

Accordingly, the present invention is provided to substantially obviate one or more problems due to limitations and disadvantages of the related art.

In an example embodiment of the present invention, a filter tuning system includes a time constant detector, a comparator and a calibration unit. The time constant detector detects a time constant of a filter based on an integral value of a reference input signal using an integrator when the time constant of the filter changes according to a variation of a manufacturing process or a temperature. The integrator includes a capacitor changing according to a variation of the time constant of the filter. The capacitor included in the integrator is located in the same environment as the filter. The comparator compares the detected time constant with a reference value. The calibration unit compensates the time constant of the filter using a binary search algorithm based on the comparison result until an error between the time constant and the reference value is reduced within an acceptable range.

The time constant detector may include an operational amplifier having a first input terminal coupled to a ground voltage, a second input terminal coupled to a resistor and an output terminal. The capacitor may be coupled between the second input terminal of the operational amplifier and the output terminal of the operational amplifier.

The capacitor may include a plurality of capacitors and a plurality of switches. The capacitance of each of the capacitors may be double the capacitance of an adjacent capacitor. Each of the switches may be coupled to each of the capacitors. Each of the switches may be controlled in response to each bit of a calibration signal.

The comparator may generate a first logic value when an output signal of the time constant detector is higher than the reference value. The comparator may generate a second logic value when an output signal of the time constant detector is lower than the reference value.

The calibration unit may decrease the time constant by a unit of a calibration interval when an output signal of the comparator corresponds to a first logic value. The calibration unit may increase the time constant by a unit of the calibration interval when the output signal of the comparator corresponds to a second logic value. The calibration unit may decrease a calibration interval for the next repetition by half of the calibration interval for a current repetition when repeating the increasing or decreasing of the time constant.

In another example embodiment of the present invention, a method of tuning a filter includes detecting a time constant of the filter when the time constant of the filter changes according to a variation of a manufacturing process or a temperature, comparing the detected time constant with a reference value, and compensating the time constant of the filter using a binary search algorithm based on the comparison result until an error between the time constant and the reference value is reduced within an acceptable range.

Detecting the time constant of the filter may include detecting the time constant based on an integral value using a resistor and a capacitor changing according to a variation of the time constant of the filter, the capacitor being located in the same environment as the filter.

Comparing the detected time constant with the reference value may include generating a first logic value when the detected time constant is higher than the reference value, and generating a second logic value when the detected time constant is lower than the reference value.

Compensating the time constant may include repeating an increasing or decreasing of the time constant of the filter based on the comparison result until an error between the time constant and the reference value is reduced within an acceptable range.

Compensating the time constant may include decreasing the time constant when the comparison result corresponds to a first logic value, increasing the time constant when the comparison result corresponds to a second logic value, and decreasing a calibration interval for the next repetition by half of a calibration interval for a current repetition when repeating the increasing or decreasing of the time constant.

In still another example embodiment of the present invention, a signal processor includes a filter, a filter tuning system and a register block. A cutoff frequency of the filter is determined by a time constant. The filter tuning system compensates the time constant when the time constant changes according to a variation of a manufacturing process or a temperature. The register block maintains the compensated time constant. The filter tuning system includes a time constant detector, a comparator and a calibration unit. The time constant detector detects the time constant of the filter when the time constant of the filter changes according to the variation of the manufacturing process or the temperature. The comparator compares the detected time constant with a reference value. The calibration unit compensates the time constant of the filter using a binary search algorithm based on the comparison result until an error between the time constant and the reference value is reduced within an acceptable range.

BRIEF DESCRIPTION OF THE DRAWINGS

The above and other advantages of the present invention will become more apparent by describing in detail example embodiments thereof with reference to the accompanying drawings, in which:

FIG. 5 is a flowchart illustrating a method of tuning the filter according to an example embodiment of the present invention.

BEST MODE FOR CARRYING OUT THE INVENTION

Figure 1:
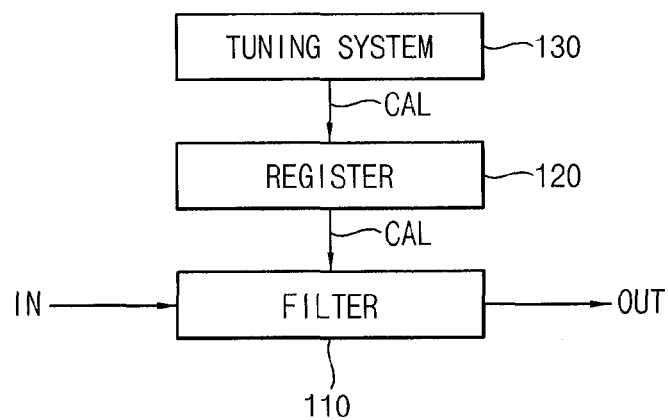
FIG. 1 is a block diagram illustrating a signal processor including a filter tuning system according to an example embodiment of the present invention.

Embodiments of the present invention now will be described more fully with reference to the accompanying drawings, in which embodiments of the to invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Hereinafter, the present invention will be described in detail with reference to the accompanying drawings.

FIG. 1 is a block diagram illustrating a signal processor including a filter tuning system according to an example embodiment of the present invention.

Referring to FIG. 1, the signal processor according to an example embodiment of the present invention includes a filter 110, the filter tuning system 130 for compensating for a variation of the time constant, and a register block 120.

The filter 110 performs filtering on an input signal IN to generate an output signal OUT. The filter 110 may be widely used for processing a signal. Various kinds of filters including a low-pass filter, a high-pass filter and a band-pass filter may be used. A time constant of the filter 110 may change according to a variation of a manufacturing process or a temperature, and accordingly a cutoff frequency of the filter 110 may change. The filter tuning system 130 compensates the cutoff frequency to be close to a reference value. When the compensation is finished, the register block 120 stores a calibration signal CAL for maintaining the compensated time constant.

Figure 2:
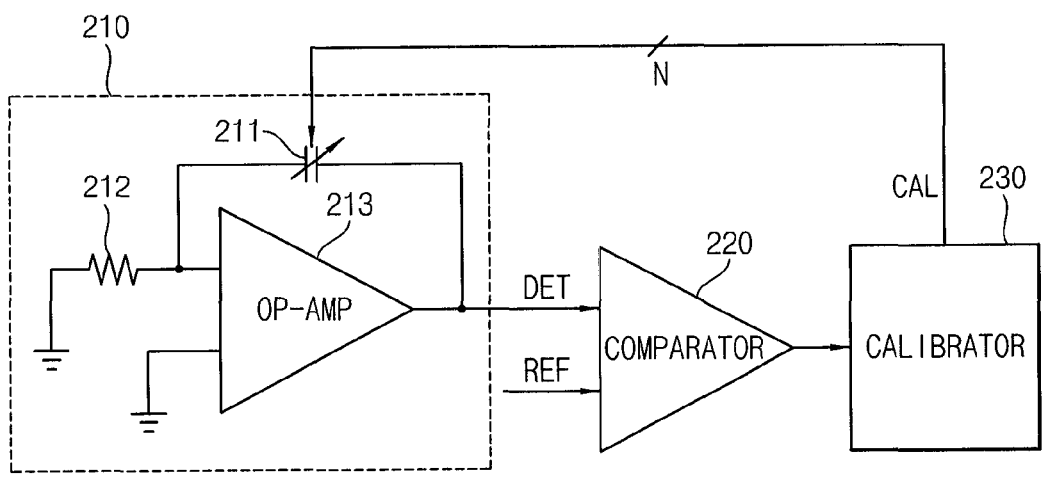
FIG. 2 is a block diagram illustrating a configuration of the filter tuning system according to an example embodiment of the present invention.

FIG. 2 is a block diagram illustrating a configuration of the filter tuning system according to an example embodiment of the present invention.

Referring to FIG. 2, the filter tuning system includes a time constant detector 210, a comparator 220 and a calibration unit 230.

The time constant detector 210 detects the time constant of the filter. In an example embodiment, an integrator configured to convert the time constant to a voltage signal may be used for detecting the time constant. The integrator may be implemented with an operational amplifier 213, a resistor 212 and a capacitor 211. The resistance of the resistor 212 and the capacitance of the capacitor 211 may be adjusted based on the time constant of the filter. When the resistance of the resistor or the capacitance of the capacitor included in the filter changes, the resistance of the resistor 212 and the capacitance of the capacitor 211 included in the integrator located in the same environment change with similar characteristics. Thus, the time constant of the filter may be detected using the integrator.

The comparator 220 compares the detected time constant DET with a reference value REF. When the detected time constant DET is higher than the reference value REF, the comparator 220 may generate a logic high value. When the detected time constant DET is lower than the reference value REF, the comparator 220 may generate a logic low value. Herein, the detected time constant DET and the reference value may be various kinds of signals for comparison.

The calibration unit 230 calibrates the time constants of the filter and the integrator based on the comparison result. Herein, the filter tuning system may use the binary search algorithm. The calibration signal CAL may correspond to an N-bit digital signal. In the conventional filter tuning system, the time constant of the filter is calibrated by a unit of the LSB. Thus, it may take a long time to calibrate the time constant when an error is relatively large. In the present invention, however, the time constant of the filter may be calibrated by a unit of calibration intervals gradually changing from the most significant bit (MSB) to the least significant bit (LSB). The calibration of the time constant may be finished within N searches when the N-bit calibration signal is used.

Figure 3:
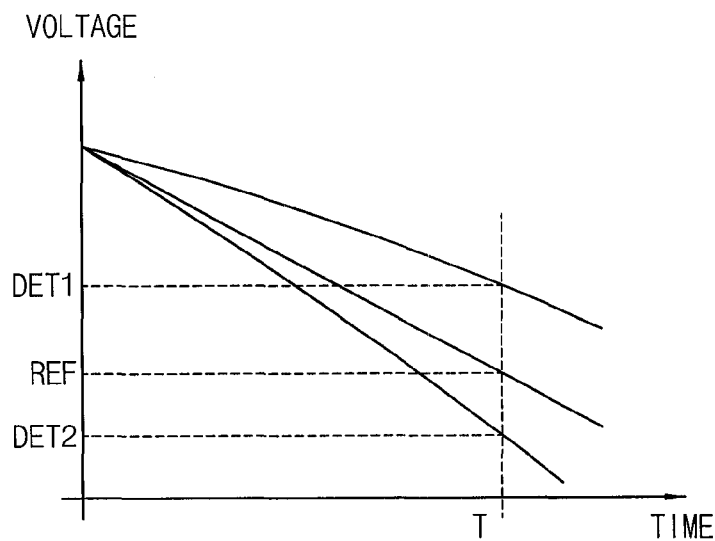
FIG. 3 is a diagram illustrating an output of the time constant detector.

FIG. 3 is a diagram illustrating an output of the time constant detector.

Referring to FIG. 3, the time constant detector of the filter tuning system detects the time constant using an output signal of the integrator integrating a reference input signal. When the resistance of the resistor and the capacitance of the capacitor in the integrator correspond to R and C respectively, slopes of lines in FIG. 3 are proportional to $-1/RC$. When the capacitance changes, the slopes of the lines change according to the change of the capacitance. The filter tuning system may compare the time constant of the filter with a reference time constant by detecting output signals DET1 and DET2 of the integrator during a predetermined period T and comparing the detected values with the reference value REF.

For example, an output signal DET1 of the integrator is higher than the reference value REF in FIG. 3. Then, the slope of the line in FIG. 3 is low and the time constant of the filter is higher than a required time constant. Thus, the time constant may need to be decreased. In addition, an output signal DET2 of the integrator is lower than the reference value REF in FIG. 3, the slope of the line in FIG. 3 is high and the time constant of the filter is lower than the required time constant. Thus, the time constant may need to be increased.

Figure 4:
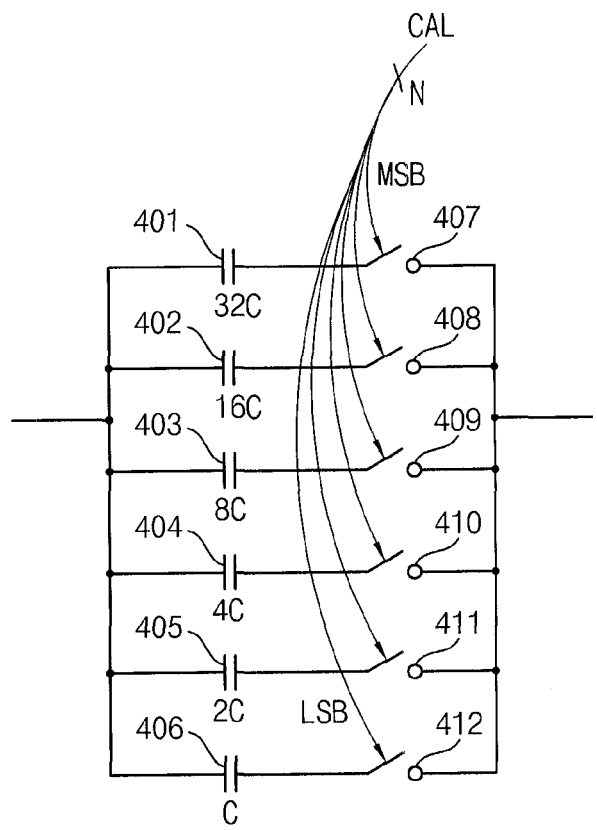
FIG. 4 is a circuit diagram illustrating a capacitor array for calibrating the time constant of the time constant detector.

FIG. 4 is a circuit diagram illustrating a capacitor array for calibrating the time constant of the time constant detector.

Referring to FIG. 4, the time constant detector of the filter tuning system calibrates the capacitance of the integrator using the calibration signal CAL. In an example embodiment of the present invention, a plurality of capacitors coupled in parallel and switches coupled to each of the capacitors are used to adjust the capacitance. According to example embodiments, various circuits for calibrating the capacitance may be used.

When the calibration signal corresponds to a 4-bit digital signal in the tuning system in FIG. 4, six capacitors 401, 402, 403, 404, 405 and 406 may be used to calibrate the capacitance. The capacitance of each of the capacitors may be decreased by half of an adjacent capacitor. Thus, the capacitors 401, 402, 403, 404, 405 and 406 may have capacitances of 32 C 16 C, 8 C, 4 C, 2 C and C respectively. The capacitance of each of the capacitor corresponds to a calibration interval represented by each bit from the MSB to the LSB of the calibration signal. Each bit of the control signal from the MSB to the LSB may turn on/off each of switches 407 through 412 to determine the total capacitance of the capacitor array. The total capacitance of the capacitor array may be determined by a sum of capacitances of the capacitors coupled to the switches 407 through 412. In an example embodiment in FIG. 4, the total capacitance may be adjusted to be 0C through 63C.

FIG. 5 is a flowchart illustrating a method of tuning the filter according to an example embodiment of the present invention.

When the filter needs to be operated, the calibration unit provides the N- bit calibration signal to the capacitor array to calibrate the capacitance of the capacitor array. Initially, the tuning system initializes the calibration signal (step S501).

Then, the tuning system sets the MSB as the calibration interval (step S502). Thus, an initial calibration may be roughly performed. As the calibration is repeated, a calibration interval for the next repetition is decreased by half of the calibration interval for a current repetition based on the binary search algorithm (step S509). The resistor and the capacitor in the time constant detector 210 change according to the variation of the time constant of the filter. Thus, the time constant of the filter may be detected using the time constant detector 210 (step S503). The comparator compares the output of the time constant detector 210 with the reference value to generate the comparison result provided to the calibration unit (step S504). The calibration unit checks whether or not the error between the detected time constant and the reference value is acceptable. Herein, the calibration unit may check whether or not the calibration interval corresponds to the LSB (step S505). When the calibration is finished with the LSB of the calibration signal, the tuning operation is finished (step S510), and the calibration signal is stored in the register to maintain the compensated the time constant (step S511). When the calibration is not yet finished with the calibration signal of the LSB, and the detected time constant is higher than the reference value (step S506), the tuning system decreases the time constant of the filter (step S507). Herein, a value of a corresponding bit of the calibration signal may be set to "0". In addition, when the detected time constant is lower than the reference value (step S506), the tuning system increases the time constant of the filter (step S508). Herein, a value of a corresponding bit of the calibration signal may be set to "1". In an example embodiment, the time constant of the filter is compensated at the same time as the calibration of the time constant of the time constant detector. In another example embodiment, the time constant of the filter may be calibrated after finishing the calibration of the time constant of the time constant detector. In the initial calibration, the error may be relatively large because the calibration bit corresponds to the MSB. Thus, a tuning operation may be performed by repeating the detecting and calibrating of the time constant with the calibration bit which changes from the MSB to the LSB by a unit of one bit.

Therefore, in the method of tuning filter according to an example embodiment of the present invention, the filter tuning operation may be finished within N repetitions of the above steps from the MSB to the LSB.

INDUSTRIAL APPLICABILITY

As described above, the filter tuning system and the method of tuning the filter according to example embodiments of the present invention use a binary search algorithm for compensating for a variation of a time constant and a cutoff frequency. Thus, the filter tuning operation may be quickly performed even when the variation of the time constant is relatively large. Additionally, a variation of time for the filter tuning is relatively insensitive to the number of bits of the calibration signal and the resolution of the tuning system.

The invention claimed is:
1. A filter tuning system comprising:
a time constant detector configured to detect a time constant of a filter based on an integral value of a reference input signal using a integrator when the time constant of the filter changes according to a variation of a manufacturing process or a temperature, the integrator including a capacitor changing according to a variation of the time constant of the filter, the capacitor included in the integrator being located in the same environment as the filter;

a comparator configured to compare the detected time constant with a reference value; and a calibration unit configured to compensate the time constant of the filter using a binary search algorithm based on the comparison result until an error between the time constant and the reference value is reduced within an acceptable range, wherein the calibration unit decreases the time constant by a unit of a calibration interval when the comparison result corresponds to a first logic value, the calibration unit increases the time constant by a unit of the calibration interval when the comparison result corresponds to a second logic value, and the calibration unit decreases a calibration interval for the next repetition by half of the calibration interval for a current repetition when repeating the increasing or decreasing of the time constant.

2. The filter tuning system of claim 1, wherein the time constant detector includes an operational amplifier having a first input terminal coupled to a ground voltage, a second input terminal coupled to a resistor, and the capacitor is coupled between the second input terminal of the operational amplifier and the output terminal of the operational amplifier.

3. The filter tuning system of claim 1, wherein the capacitor comprises:

a plurality of capacitors, the capacitance of each of the capacitors being double the capacitance of an adjacent capacitor; and a plurality of switches coupled, each of the switches being coupled to a corresponding one of the plurality of the capacitors, each of the switches being controlled in response to each bit of a calibration signal.

4. The filter tuning system of claim 1, wherein the comparator generates the first logic value when the detected time constant is higher than the reference value, and the comparator generates the second logic value when the detected time constant is lower than the reference value.

5. A method of tuning a filter, comprising:

detecting a time constant of the filter when the time constant of the filter changes according to a variation of a manufacturing process or a temperature;

comparing the detected time constant with a reference value; and compensating the time constant of the filter using a binary search algorithm based on the comparison result until an error between the time constant and the reference value is reduced within an acceptable range, wherein compensating the time constant comprises:

decreasing the time constant when the comparison result corresponds to a first logic value;

increasing the time constant when the comparison result corresponds to a second logic value; and decreasing a calibration interval for the next repetition by half of a calibration interval for a current repetition when repeating the increasing or decreasing of the time constant.

6. The method of claim 5, wherein detecting the time constant of the filter comprises:

detecting the time constant based on an integral value using a resistor and a capacitor changing according to a variation of the time constant of the filter, the capacitor being located in the same environment as the filter.

7. The method of claim 5, wherein comparing the detected time constant with the reference value comprises:

generating the first logic value when the detected time constant is higher than the reference value; and generating the second logic value when the detected time constant is lower than the reference value.

8. The method of claim 5, wherein compensating the time constant comprises:

repeating the increasing or decreasing of the time constant of the filter based on the comparison result until the error between the time constant and the reference value is reduced within the acceptable range.

9. A signal processor comprising:

a filter, a cutoff frequency of the filter being determined by a time constant;

a filter tuning system configured to compensate the time constant when the time constant changes according to a variation of a manufacturing process or a temperature; and a register block configured to maintain the compensated time constant, wherein the filter tuning system comprises:

a time constant detector configured to detect the time constant of the filter when the time constant of the filter changes according to the variation of the manufacturing process or the temperature;

a comparator configured to compare the detected time constant with a reference value; and a calibration unit configured to compensate the time constant of the filter using a binary search algorithm based on the comparison result until an error between the time constant and the reference value is reduced within an acceptable range.

* * * * *